United States Patent
Cai et al.

(10) Patent No.: US 8,957,464 B2
(45) Date of Patent: Feb. 17, 2015

(54) TRANSISTORS WITH UNIAXIAL STRESS CHANNELS

(71) Applicant: International Business Machines Corporation, Armonk, NY (US)

(72) Inventors: Ming Cai, Hopewell Junction, NY (US); Dechao Guo, Fishkill, NY (US); Liyang Song, Wappingers Falls, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/154,281

(22) Filed: Jan. 14, 2014

(65) Prior Publication Data

US 2014/0124861 A1     May 8, 2014

Related U.S. Application Data

(62) Division of application No. 13/396,872, filed on Feb. 15, 2012, now Pat. No. 8,633,077.

(51) Int. Cl.

| | |
|---|---|
| *H01L 29/78* | (2006.01) |
| *H01L 21/84* | (2006.01) |
| *H01L 29/66* | (2006.01) |
| *H01L 29/10* | (2006.01) |
| *H01L 29/165* | (2006.01) |
| *H01L 21/762* | (2006.01) |
| *H01L 29/786* | (2006.01) |
| *H01L 21/8234* | (2006.01) |

(52) U.S. Cl.
CPC .......... *H01L 29/7846* (2013.01); *H01L 21/845* (2013.01); *H01L 29/7848* (2013.01); *H01L 29/66575* (2013.01); *H01L 29/66636* (2013.01); *H01L 29/66651* (2013.01); *H01L 29/1054* (2013.01); *H01L 29/165* (2013.01); *H01L 21/76224* (2013.01); *H01L 29/78684* (2013.01); *H01L 29/785* (2013.01); *H01L 21/823412* (2013.01); *H01L 21/823418* (2013.01); *H01L 21/823481* (2013.01)
USPC ....................................................... 257/288

(58) Field of Classification Search
USPC ............................. 257/27, 83, 121, 124, 288
See application file for complete search history.

(56) References Cited

U.S. PATENT DOCUMENTS

| | | | |
|---|---|---|---|
| 4,394,196 | A | 7/1983 | Iwai |
| 5,757,038 | A | 5/1998 | Tiwari et al. |
| 7,034,367 | B2 | 4/2006 | Kobori |
| 7,358,559 | B2 | 4/2008 | Tsui et al. |
| 7,795,669 | B2 * | 9/2010 | Georgakos et al. ........... 257/327 |
| 7,892,912 | B2 | 2/2011 | Kim |
| 8,174,074 | B2 * | 5/2012 | Lin et al. ........................ 257/347 |
| 8,222,681 | B2 * | 7/2012 | Schulze et al. ................ 257/288 |
| 8,466,501 | B2 | 6/2013 | Hershberger et al. |
| 2007/0152244 | A1 | 7/2007 | Ahn |
| 2008/0237709 | A1 * | 10/2008 | Chidambarrao et al. ..... 257/347 |
| 2010/0112796 | A1 | 5/2010 | Chou et al. |
| 2010/0323494 | A1 | 12/2010 | Liao et al. |
| 2012/0115293 | A1 | 5/2012 | Noh et al. |

* cited by examiner

*Primary Examiner* — Thao P Le

(74) *Attorney, Agent, or Firm* — Cantor Colburn LLP; Vazken Alexanian

(57) ABSTRACT

A method for fabricating a transistor with uniaxial stress channels includes depositing an insulating layer onto a substrate, defining bars within the insulating layer, recessing a channel into the substrate, growing a first semiconducting material in the channel, defining a gate stack over the bars and semiconducting material, defining source and drain recesses and embedding a second semiconducting material into the source and drain recesses.

20 Claims, 24 Drawing Sheets

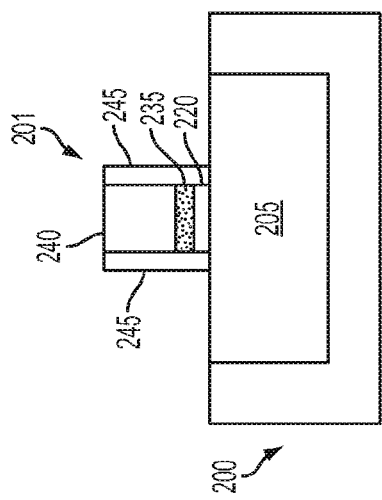
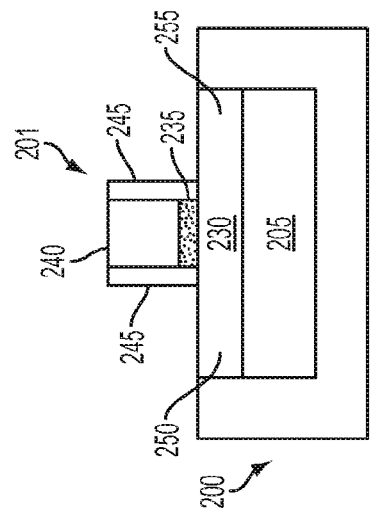
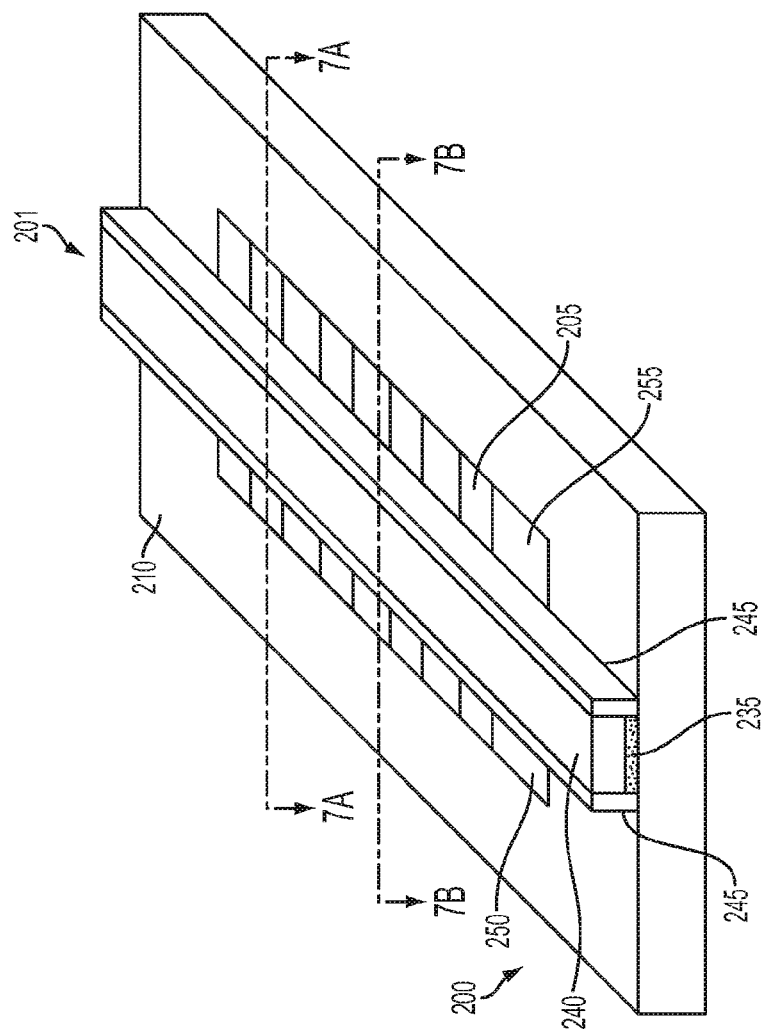

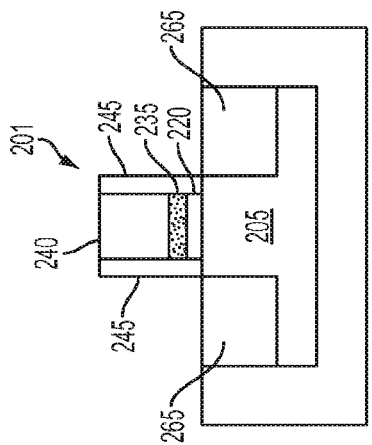
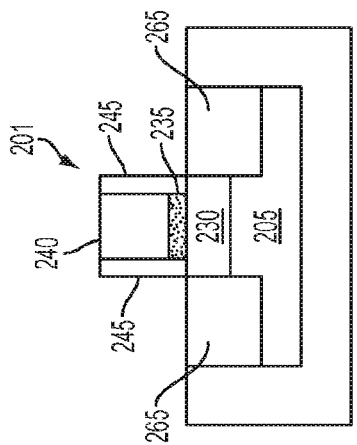
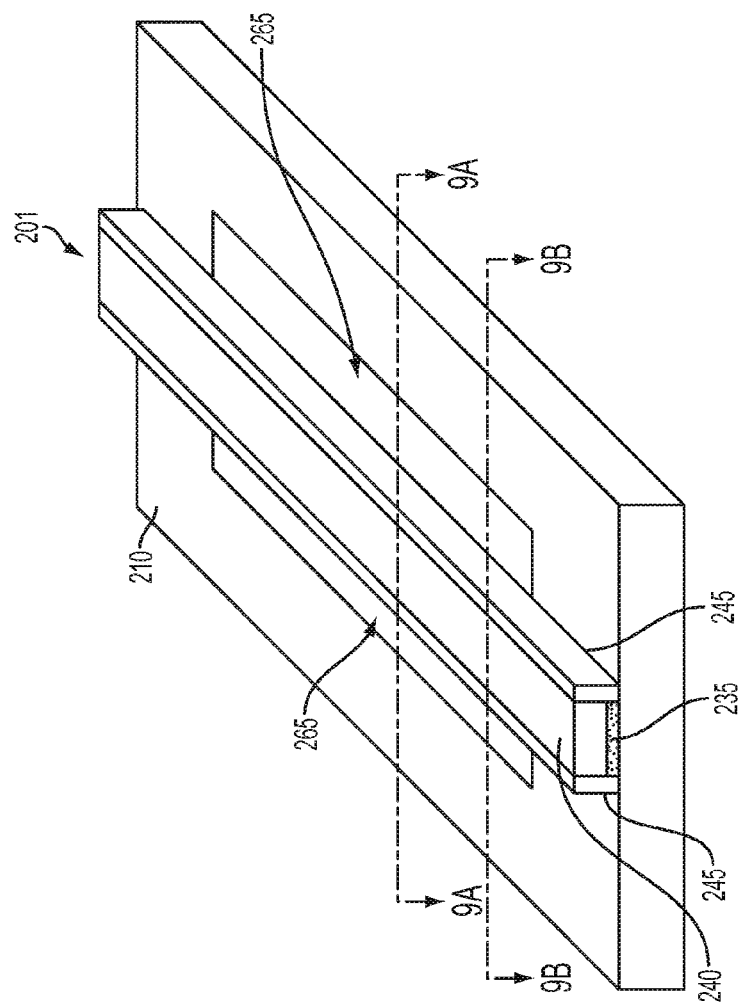

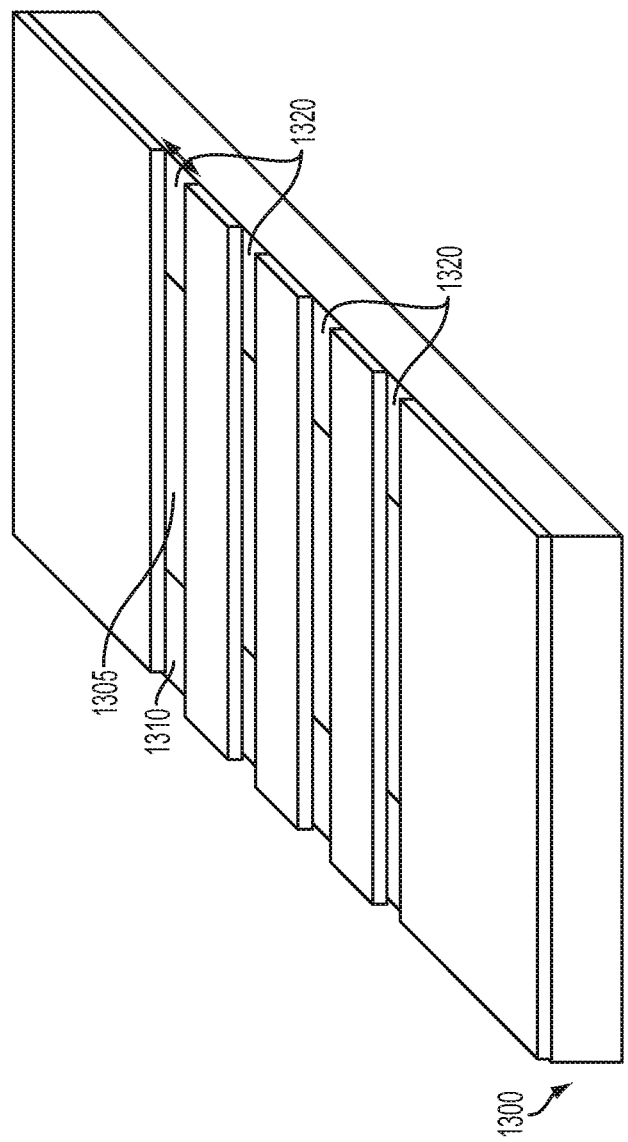

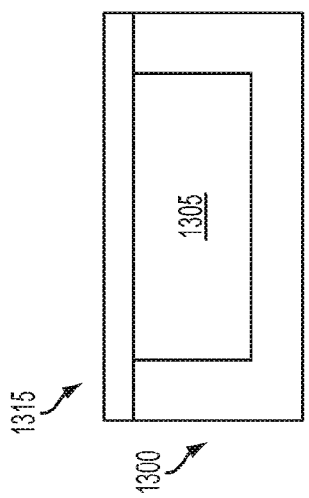
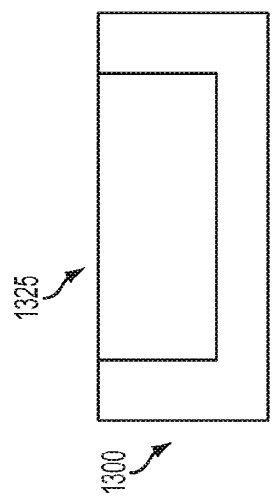
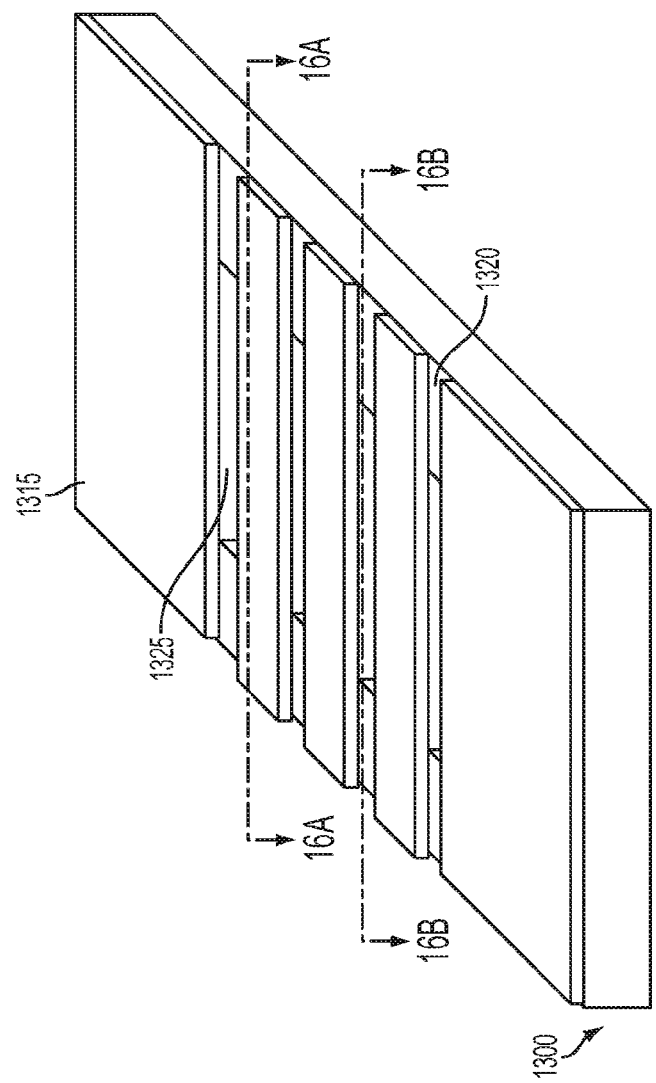

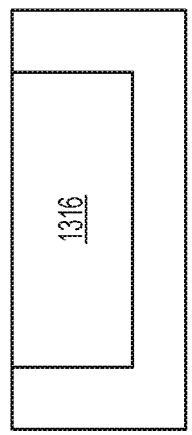
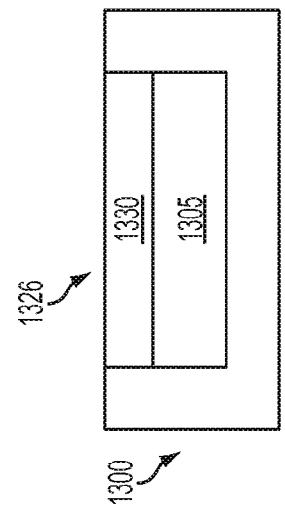
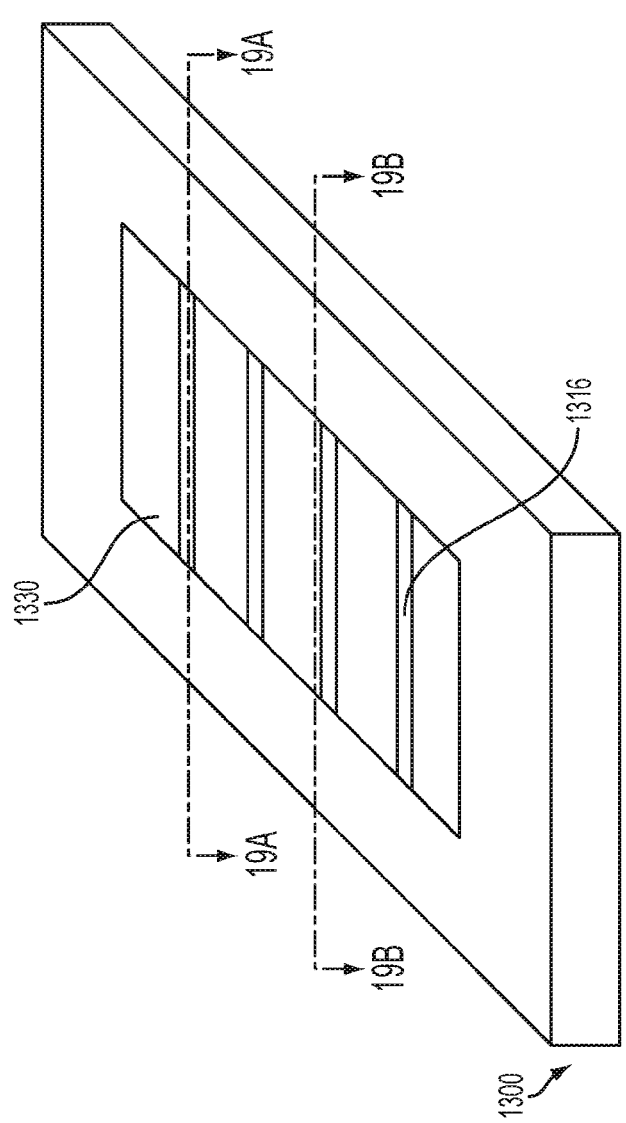

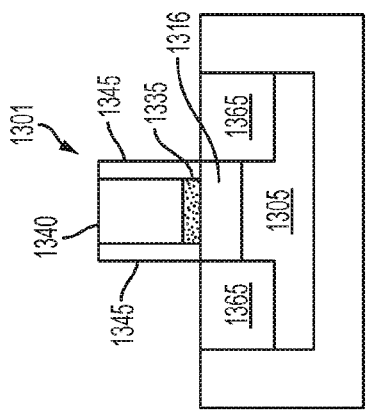
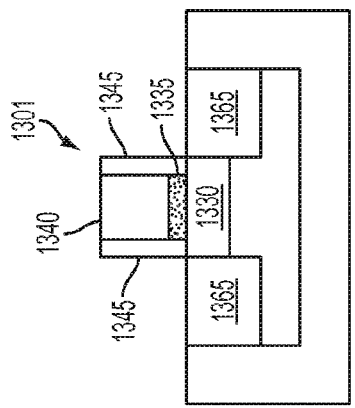
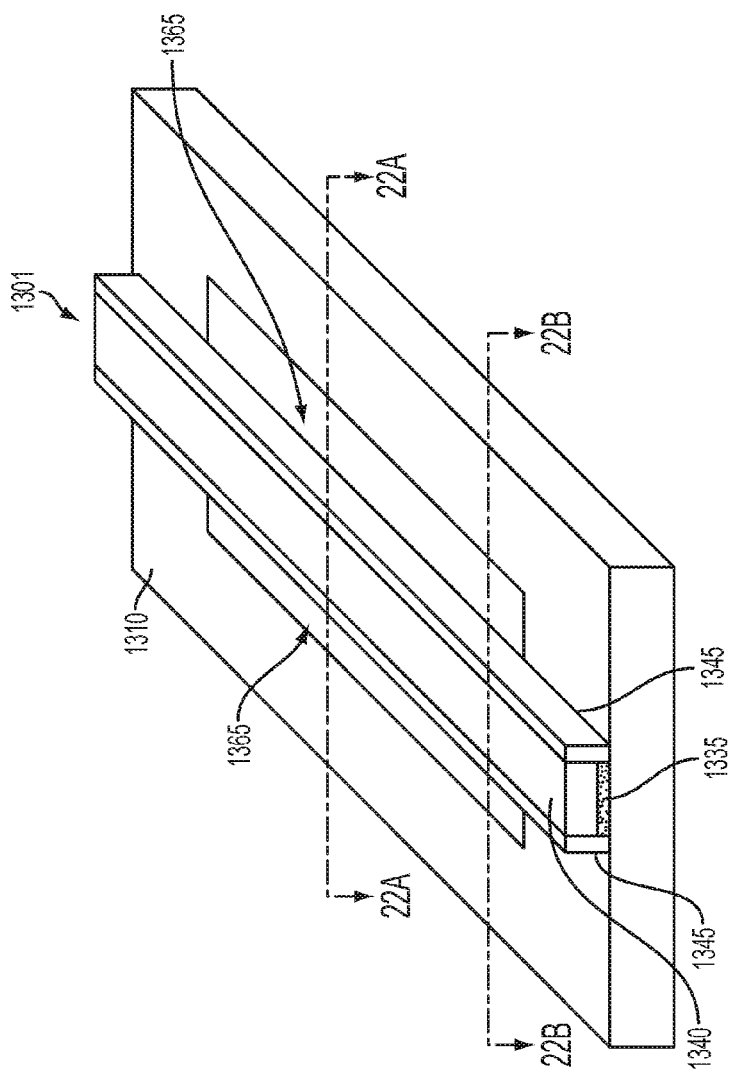

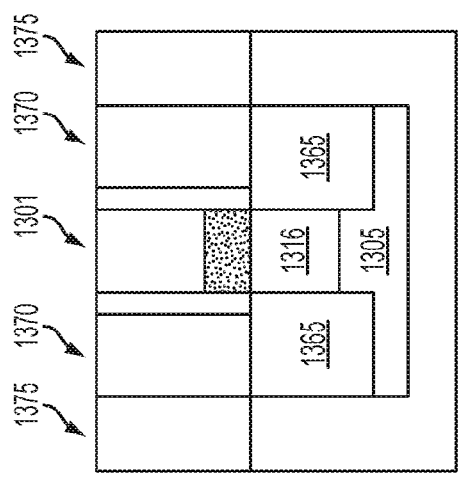
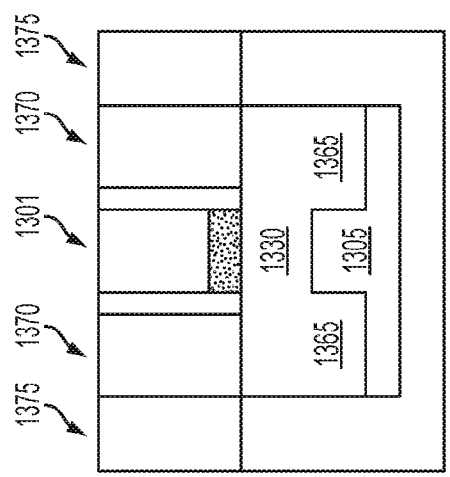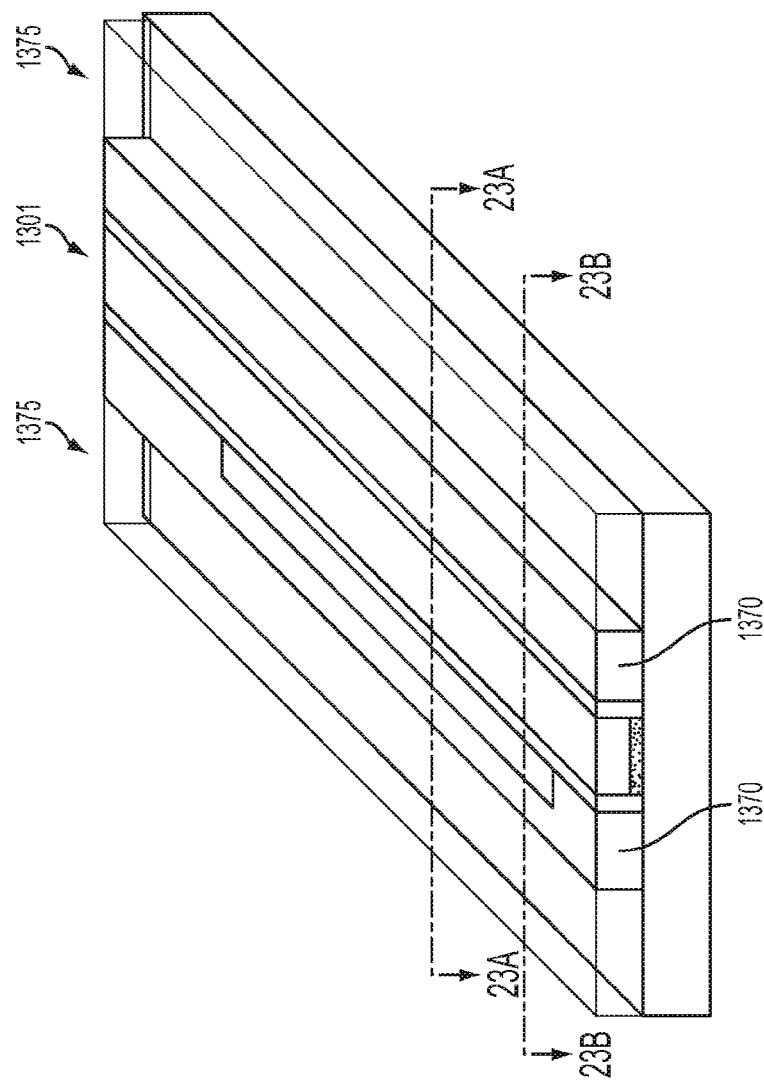

US 8,957,464 B2

TRANSISTORS WITH UNIAXIAL STRESS CHANNELS

CROSS-REFERENCE TO RELATED APPLICATION

This application is a divisional of U.S. patent application Ser. No. 13/396,872, filed Feb. 15, 2012, the disclosure of which is incorporated by reference herein in its entirety.

BACKGROUND

The present invention relates to transistor fabrication, and more specifically, to transistors with uniaxial stress channels for high hole mobility.

Typically, in logic circuits, transistors are driven with high drive current (e.g., up to 100 mA). In order to attain the high drive current, the overall width of the logic devices is increased. However, silicon germanium (SiGe) channel p-type field effect transistors (pFET) show superior hole mobility especially in narrow width devices due to the uniaxial stress enhanced mobility. In contrast, as the width of the device increases, hole mobility is decreased. As such, if the device width is increased to achieve the overall drive current, the benefits of uniaxial stress in narrow width devices (i.e., high hole mobility) is not realized. To better utilize the uniaxial stress, and make the chip area efficient, approaches are desirable to manufacture array of narrow width pFET transistors, without sacrificing chip area.

SUMMARY

Exemplary embodiments include a method for fabricating a transistor with uniaxial stress channels, the method including depositing an insulating layer onto a substrate, defining bars within the insulating layer, recessing a channel into the substrate, growing a first semiconducting material in the channel, defining a gate stack over the bars and semiconducting material, defining source and drain recesses and embedding a second semiconducting material into the source and drain recesses.

Additional exemplary embodiments include a method for fabricating a transistor with uniaxial stress channels, the method including depositing an insulating layer onto a substrate, defining spacing widths within the insulating layer, defining trenches within the spacing widths, removing the insulating layer, refilling the trenches, recessing a channel into the substrate, growing a first semiconducting material in the channel, defining a gate stack over the bars and semiconducting material, defining source and drain recesses and embedding a second semiconducting material into the source and drain recesses.

Further exemplary embodiments include a transistor structure, including active devices, each of the active devices separated by a dummy device, the active devices and the dummy devices disposed in a substrate, wherein each dummy device is electrically isolated from the substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 7 illustrates an intermediate structure showing a gate stack and spacer regions as well as source and drain regions;

FIG. 7A illustrates a cross sectional view of a region of the intermediate device of FIG. 7 adjacent a remaining portion of a bar incorporated into a gate stack;

FIG. 7B illustrates a cross-sectional view of the intermediate device of FIG. 7 underneath a gate stack;

FIG. 9 illustrates an intermediate structure showing a gate stack and semiconducting material onto which the sources and drains are subsequently defined;

FIG. 9A illustrates a cross sectional view of a region of the intermediate device of FIG. 9 adjacent a remaining portion of a bar incorporated into a gate stack;

FIG. 9B illustrates a cross-sectional view of the intermediate device of FIG. 9 underneath a gate stack;

FIG. 15 illustrates an intermediate structure showing spacings defined over a substrate;

FIG. 16 illustrates an intermediate structure showing trenches;

FIG. 16A illustrates a cross sectional view of a region of the intermediate device of FIG. 16 under a remaining portion of an insulating layer;

FIG. 16B illustrates a cross-sectional view of the intermediate device of FIG. 16 at a trench;

FIG. 19 illustrates an intermediate structure illustrating SiGe growth within recesses;

FIG. 19A illustrates a cross sectional view of a region of the intermediate device of FIG. 19 at insulating refill;

FIG. 19B illustrates a cross-sectional view of the intermediate device of FIG. 19 at semiconductor material 1330;

FIG. 22 illustrates an intermediate structure showing a gate stack and semiconducting material onto which the sources and drains are subsequently defined;

FIG. 22A illustrates a cross sectional view of a region of the intermediate device of FIG. 22 showing a remaining portion of an insulating refill adjacent a gate stack;

FIG. 22B illustrates a cross-sectional view of the intermediate device of FIG. 22 underneath a gate stack;

FIG. 23 illustrates a final FET structure that includes an interconnect bar that interconnects fabricated active devices;

FIG. 23A illustrates a cross sectional view of a region of the final FET device of FIG. 23;

FIG. 23B illustrates a cross section view of another region of the final FET device of FIG. 23;

DETAILED DESCRIPTION

In exemplary embodiments, the systems and methods described herein utilize uniaxial stress enhanced mobility to manufacture an array of narrow width pFET transistors, without sacrificing chip area. The systems and methods described herein an also be implemented to manufacture devices that require high overall drive current.

Figure 1:
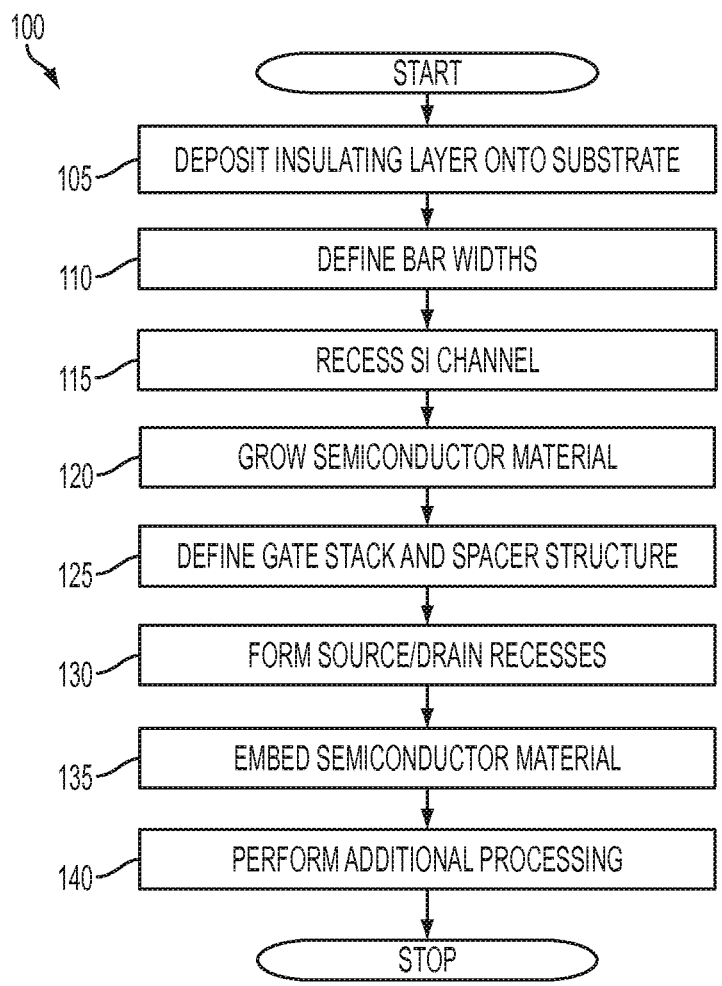
FIG. 1 illustrates a flow chart of a method for fabricating a transistor with uniaxial stress channels in accordance with exemplary embodiments.
Figure 2:
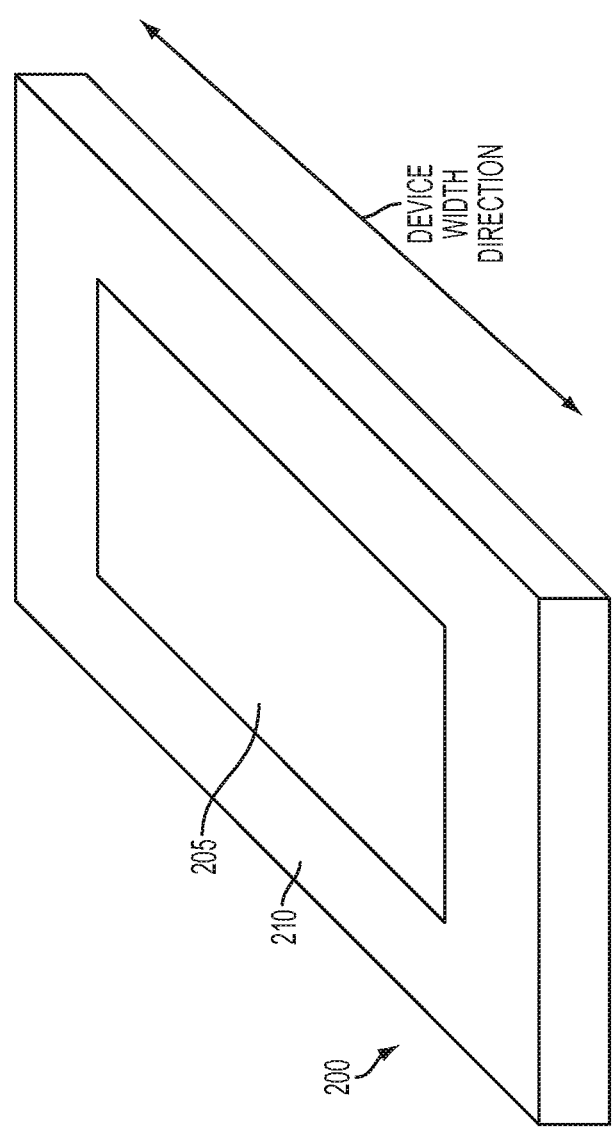
FIG. 2 illustrates an example of a substrate onto which exemplary transistors described herein can be fabricated.

FIG. 1 illustrates a flow chart of a method 100 for fabricating a transistor with uniaxial stress channels in accordance with exemplary embodiments. FIG. 2 illustrates an example of a substrate 200 onto which the exemplary transistors described herein can be fabricated. In exemplary embodiments, the substrate 200 is a shallow trench isolation (STI) structure. STI, also known as box isolation technique, is an integrated circuit feature which prevents electrical current leakage between adjacent semiconductor device components. For example, the substrate 200 can include a center of semiconducting material 205, such as but not limited to, silicon (Si) and an insulating border 210 such as, but not limited to, silicon dioxide ($SiO_2$). It will be appreciated that the substrate 200 can be other materials and other structures other than STI in other exemplary embodiments.

Figure 3:
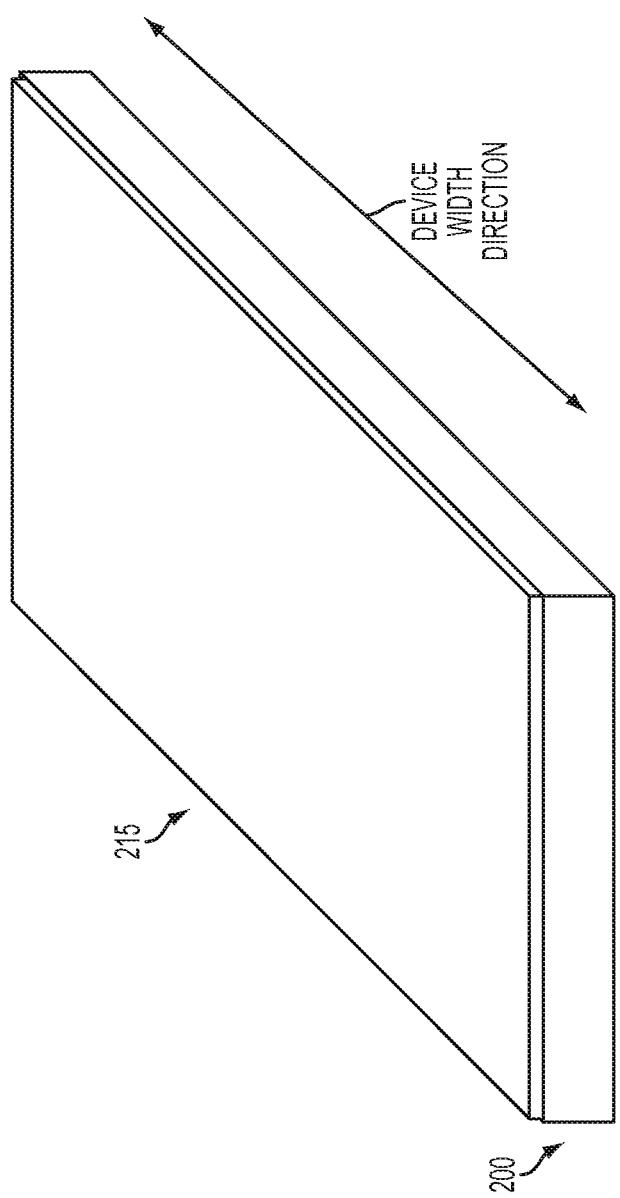
FIG. 3 illustrates an intermediate structure illustrating an insulating layer deposited on a substrate.
Figure 4:
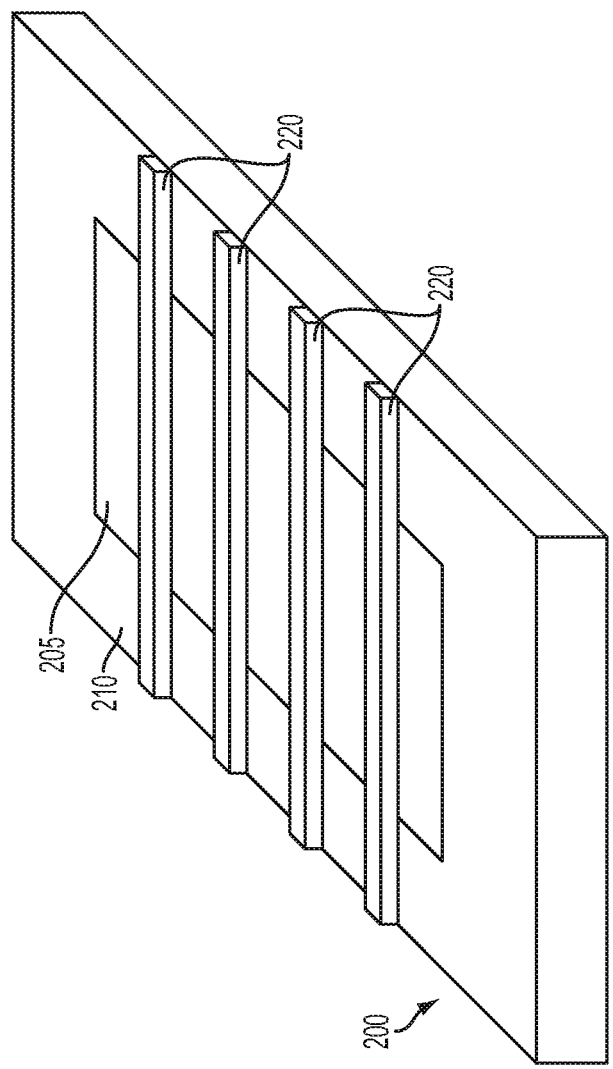
FIG. 4 illustrates an intermediate structure showing bars defined over a substrate.

At block 105, an insulating (hard-mask) layer 215 is deposited onto the substrate 200. The insulating layer 215 can be any insulating material including but not limited to silicon nitride (SiN). FIG. 3 illustrates an intermediate structure illustrating the insulating layer 215 deposited on the substrate 200. At block 110, narrow bars 220 are defined from the insulating layer 215 over the substrate 200. In exemplary embodiments, the bar width can be as low as 20 nm. In addition, the insulating layer 215 can be formed using any suitable deposition technique such as but not limited to FinFet spacer image transfer (SIT). The term "FinFET" is a generic term to describe any fin-based, multigate transistor architecture regardless of number of gates. It can also be appreciated that any suitable photolithography and masking methods are implemented to define the bars 220. In addition, any suitable etching techniques such as, but not limited to, wet chemical etching and reactive ion etching (RIE) are implemented to define the bars 220 at block 110. FIG. 4 illustrates an intermediate structure showing the bars 220 defined over the substrate 200. It should be noted that not only a narrow nitride hardmask is needed to achieve the desired uniaxial transport, a narrow pitch is also required to maximize the active device effective width per footprint. As the dummy device occupies chip area without contributing to the drive current.

Figure 5A:
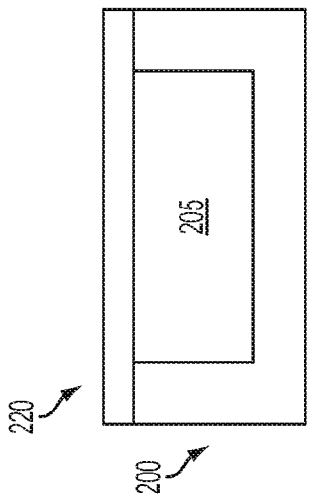
FIG. 5A illustrates a cross sectional view of a region of the intermediate device of FIG. 5 under a bar.
Figure 5B:
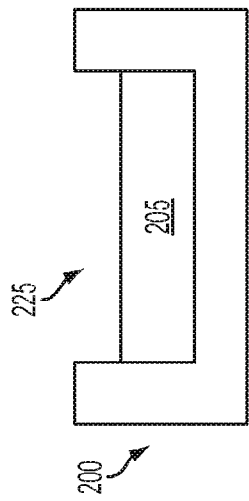
FIG. 5B illustrates a cross-sectional view of the intermediate device of FIG. 5 at a recess.
Figure 5:
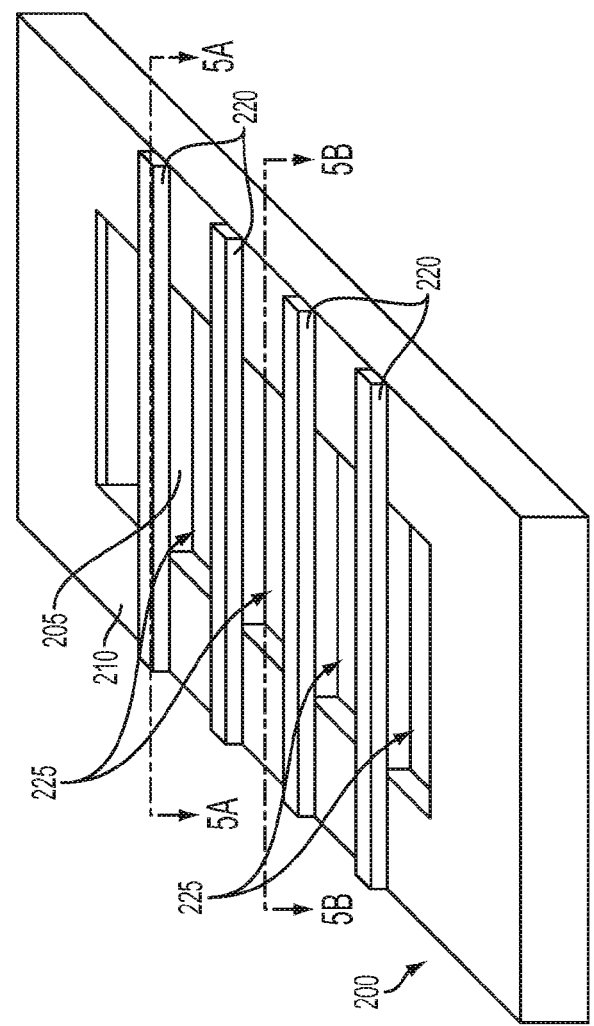
FIG. 5 illustrates an intermediate structure showing Si recesses.

At block 115, recesses are defined into the silicon portion of the substrate 200 between the bars 220. Any suitable photolithography and masking methods are implemented to define the Si recesses. In addition, any suitable etching techniques such as, but not limited to, wet chemical etching and RIE are implemented. FIG. 5 illustrates an intermediate structure showing the Si recesses 225. FIG. 5A illustrates a cross sectional view of a region of the intermediate device under the bar 220 and FIG. 5B illustrates a cross-sectional view of the intermediate device at a recess 225.

Figure 6A:
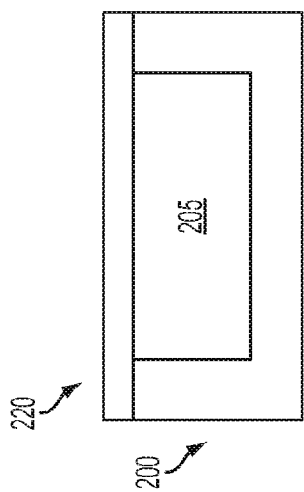
FIG. 6A illustrates a cross sectional view of a region of the intermediate device of FIG. 6 under a bar.
Figure 6B:
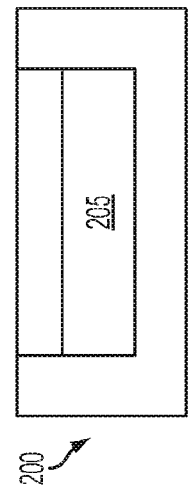
FIG. 6B illustrates a cross-sectional view of the intermediate device of FIG. 6 at a semiconductor material region.
Figure 6:
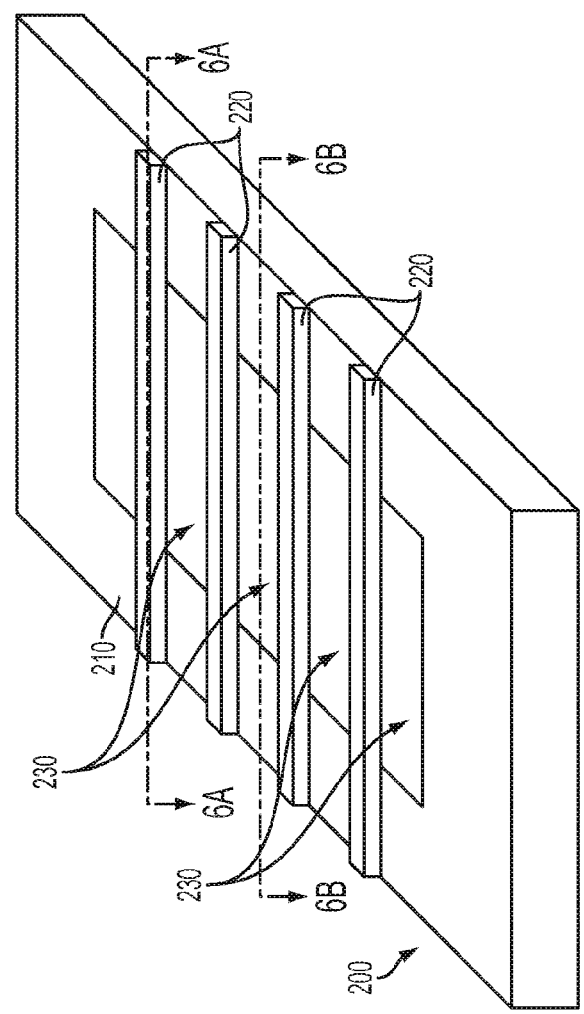
FIG. 6 illustrates an intermediate structure illustrating SiGe growth within recesses.

At block 120, a suitable semiconductor material 230 is grown within the recesses 225. In exemplary embodiments, the semiconductor material is SiGe. The semiconductor material 230 can be grown with any suitable technique, including, but not limited to molecular beam epitaxy (MBE). As described herein, SiGe channel pFETs show superior hole mobility especially in narrow width devices due to the uniaxial stress enhanced mobility. FIG. 6 illustrates an intermediate structure illustrating the SiGe growth within the recesses 225. FIG. 6A illustrates a cross sectional view of a region of the intermediate device under the bar 220 and FIG. 6B illustrates a cross-sectional view of the intermediate device at the semiconductor material 230.

At block 125, a gate stack 201 and spacer structure is defined. It can be appreciated that the gate stack 201 can be any suitable gate stack. For example, the exemplary transistors described can be high-κ metal-gate (HKMG) transistors in which high-κ dielectrics are used in conjunction with metals to form the gate stack 201. The term "high-κ dielectric" refers to a material with a high dielectric constant κ (for example, as compared to $SiO_2$) used in semiconductor manufacturing processes, which replaces the $SiO_2$ only gate dielectric. The gate stack 201 can therefore include an HK dielectric layer 235 deposited over the bars 220 and the semiconductor material 230. The HK dielectric layer 235 can be any suitable HK dielectric material such as, but not limited to, hafnium (Hf). The gate stack 201 can further include a metal layer 240 including, but not limited to, aluminum (Al). Suitable isolating spacers 245 are then defined adjacent the gate stack 201. As further described herein, the spacers 245 are any suitable insulating material (e.g., SiN) that provides isolation between the gate stack 201 and the subsequently defined source and drain regions, which are subsequently defined in the SiGe regions 250, 255 adjacent to the gate stack 201. In exemplary embodiments, the spacers 220 adjacent the gate stack 201 are removed during the gate stack 201 formation, thereby exposing the semiconducting material 205 beneath the removed spacers 220. Any suitable photolithography and masking methods are implemented to define the gate stack 201 and remove the spacers 220. In addition, any suitable etching techniques such as, but not limited to, wet chemical etching and RIE are implemented. FIG. 7 illustrates an intermediate structure showing the gate stack 201 and spacer regions as well as the source and drain regions. FIG. 7A illustrates a cross sectional view of a region of the intermediate device adjacent a remaining portion of the bar 220 incorporated into the gate stack 201. It can be appreciated that the presence of the spacer 220 underneath the gate stack 201 causes electrical isolation. Thus, the devices in these regions are "dummy devices" separated the active devices described further herein. FIG. 7B illustrates a cross-sectional view of the intermediate device underneath the gate stack 201, and in which become active devices. It will be appreciated that the SiGe regions 250, 255 become the source/drain regions for the active device, as further described herein.

Figure 8A:
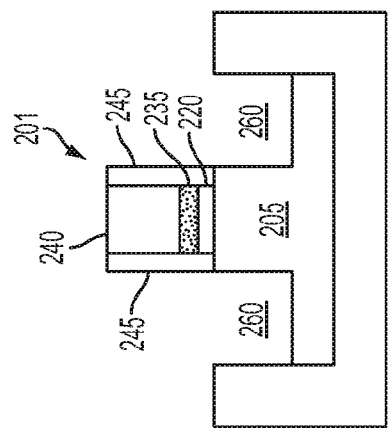
FIG. 8A illustrates a cross sectional view of a region of the intermediate device of FIG. 8 adjacent a remaining portion of a bar incorporated into a gate stack 201.
Figure 8B:
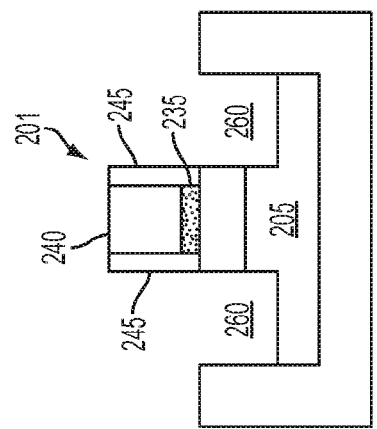
FIG. 8B illustrates a cross-sectional view of the intermediate device of FIG. 8 underneath a gate stack.
Figure 8:
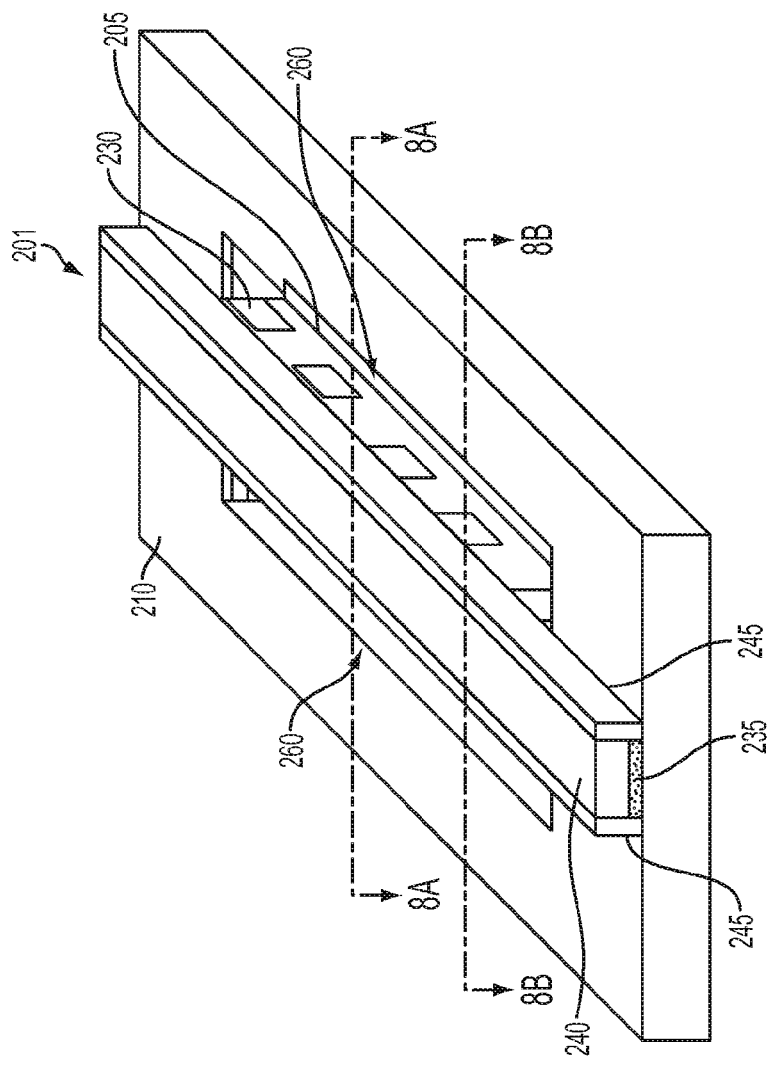
FIG. 8 illustrates an intermediate structure showing gate stack and recesses into which sources and drains are subsequently defined.

At block 130, source/drain recesses 260 are formed adjacent the gate stack 201. The formation of the recesses removes the SiGe regions 250, 255 and the remaining semiconducting material 205 previously underneath the spacers 220 adjacent the gate stack 201. FIG. 8 illustrates an intermediate structure showing the gate stack 201 and recesses 260 into which the sources and drains are subsequently defined. FIG. 8A illustrates a cross sectional view of a region of the intermediate device adjacent a remaining portion of the bar 220 incorporated into the gate stack 201, and the recesses 260. As described herein, it can be appreciated that the presence of the spacer 220 underneath the gate stack 201 causes electrical isolation. Thus the devices in these regions are "dummy devices" separated the active devices. FIG. 8B illustrates a cross-sectional view of the intermediate device underneath the gate stack 201, which become active devices, and the recesses 260. As described herein, it will be appreciated that the recesses 260 are subsequently filled with a semiconducting material into which the source/drain regions are defined.

At block 135, a semiconductor material 265 is embedded in the recesses 260. In exemplary embodiments, the semiconductor material 265 is SiGe, and shares similar properties as the semiconducting material 230 grown at block 120. For example, the semiconducting materials 230, 265 may be insitu doped with the same dopants. It can be appreciated that the source and drain regions of the semiconducting material can be doped with the same or different materials depending on the application. The semiconductor material 265 can be grown with any suitable technique, including, but not limited to MBE. FIG. 9 illustrates an intermediate structure showing the gate stack 201 and the semiconducting material 265 onto which the sources and drains are subsequently defined. FIG. 9A illustrates a cross sectional view of a region of the intermediate device adjacent a remaining portion of the bar 220 incorporated into the gate stack 201, and the semiconducting material 265. As described herein, it can be appreciated that the presence of the spacer 220 underneath the gate stack 201 causes electrical isolation. Thus the devices in these regions are "dummy devices" separated the active devices. FIG. 9B illustrates a cross-sectional view of the intermediate device underneath the gate stack 201, which become active devices, and the semiconducting material 265. FIG. 9B also illustrates the semiconducting material 230 and the semiconducting material 265. It can further be appreciated that the semiconducting materials 230, 265 are electrically and physically contiguous.

Figure 10A:
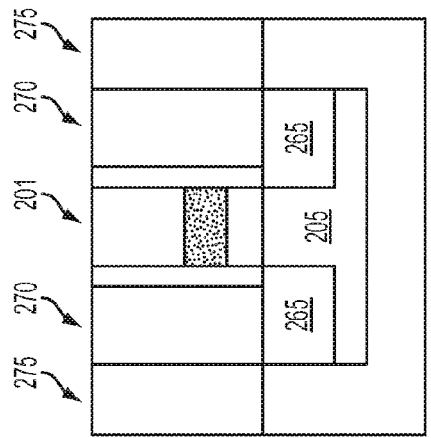
FIG. 10A illustrates a cross sectional view of a region of the final FET device of FIG. 10.
Figure 10B:
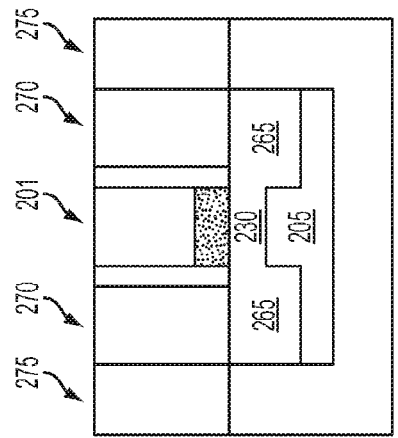
FIG. 10B illustrates a cross section view of another region of the final FET device of FIG. 10.
Figure 10:
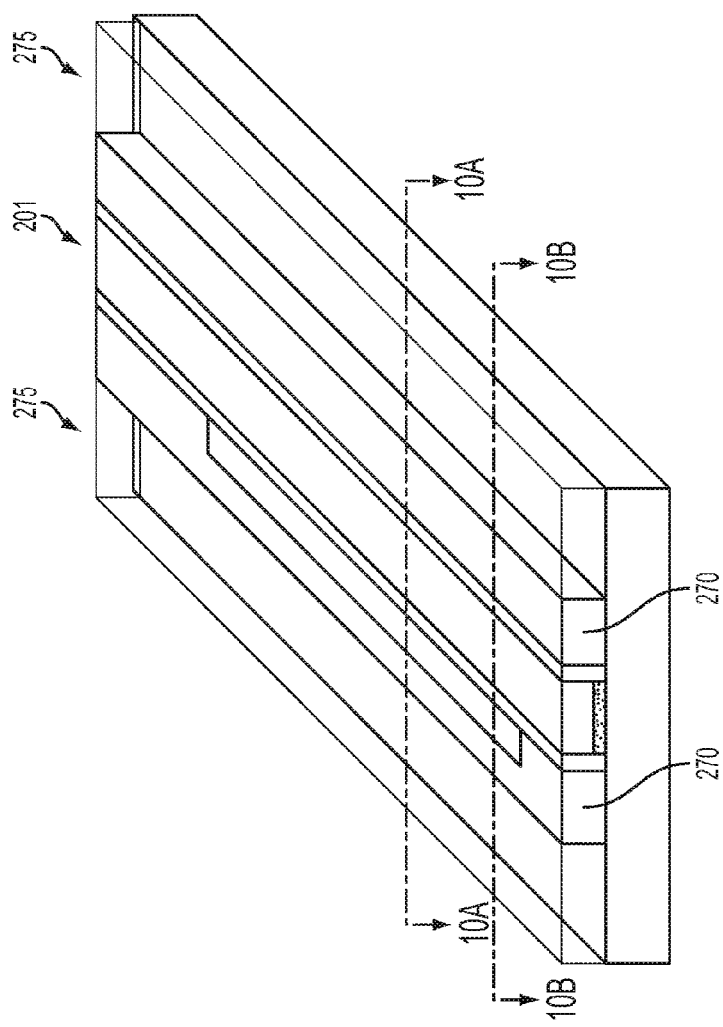
FIG. 10 illustrates a final FET structure that includes an interconnect bar that interconnects fabricated active devices.

At block 140, additional processing steps are performed to complete device fabrication. For example, standard front-end-of-line (FEOL) techniques can be performed. In FEOL techniques, the individual devices (transistors, capacitors, resistors, etc.) are patterned in the substrate. FEOL generally covers everything up to (but not including) the deposition of metal interconnect layers. FIG. 10 illustrates a final FET structure that includes an interconnect bar 270 that interconnects the fabricated active devices as described herein. The final FET structure further includes a liner 275 covering the final structure. The liner 275 may be formed adjacent to or separated from the source/drain region. The nitrogen liner may be formed to retard vertical diffusion of the dopant and also to retard lateral diffusion as well. The liner 275 may be formed by implantation of nitrogen to a given depth before the implantation of source/drain dopant to a lesser depth. FIG. 10A illustrates a cross sectional view of a region of the final FET. FIG. 10B illustrates a cross section view of another region of the final FET device. FIG. 10A represents a fake inactive "dummy" device. The device in FIG. 10A does not contribute to the off-state leakage. The threshold voltage of the fake device can be adjusted by the insulator layer represented by the portion of the bar 220. FIGS. 10A and 10B further illustrate the interconnect bar 270 and the liner 275.

Figure 11A:
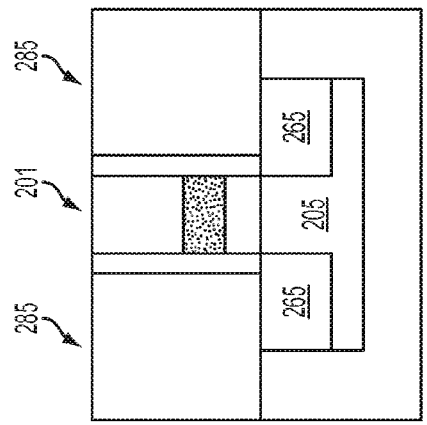
FIG. 11A illustrates a cross sectional view of a region of the final FET device of FIG. 11.
Figure 11B:
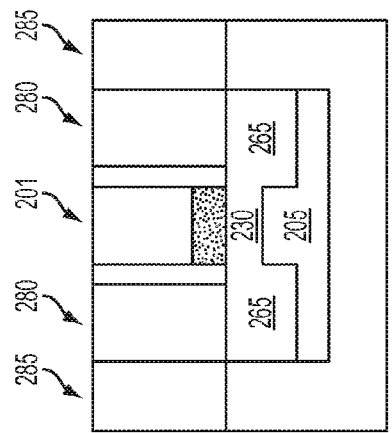
FIG. 11B illustrates a cross section view of another region of the final FET device of FIG. 11.
Figure 11:
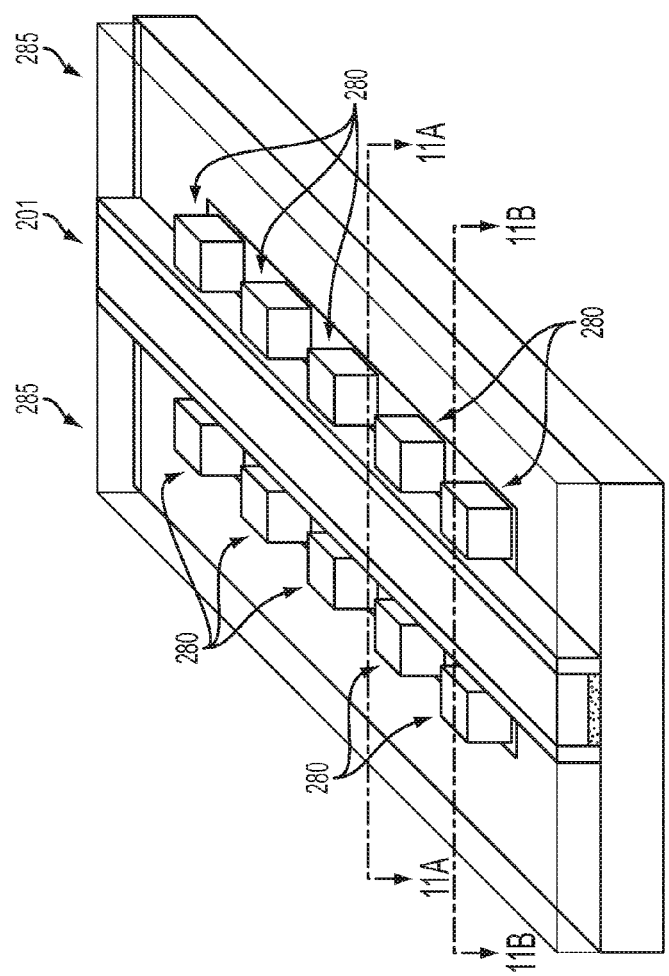
FIG. 11 illustrates a final FET structure that includes interconnect holes that interconnect fabricated active devices.

FIG. 11 illustrates a final FET structure that includes interconnect holes 280 that interconnect the fabricated active devices as described herein. The final FET structure further includes a liner 285 covering the final structure. The liner 285 may be formed adjacent to or separated from the source/drain region. The nitrogen liner may be formed to retard vertical diffusion of the dopant and also to retard lateral diffusion as well. The liner 285 may be formed by implantation of nitrogen to a given depth before the implantation of source/drain dopant to a lesser depth. FIG. 11A illustrates a cross sectional view of a region of the final FET. FIG. 11B illustrates a cross section view of another region of the final FET device. FIG. 11A represents a fake inactive "dummy" device. The device in FIG. 11A does not contribute to the off-state leakage. The threshold voltage of the fake device can be adjusted by the insulator layer represented by the portion of the bar 220. FIGS. 11A and 11B further illustrate the interconnect holes 280 and the liner 285.

Figure 12:
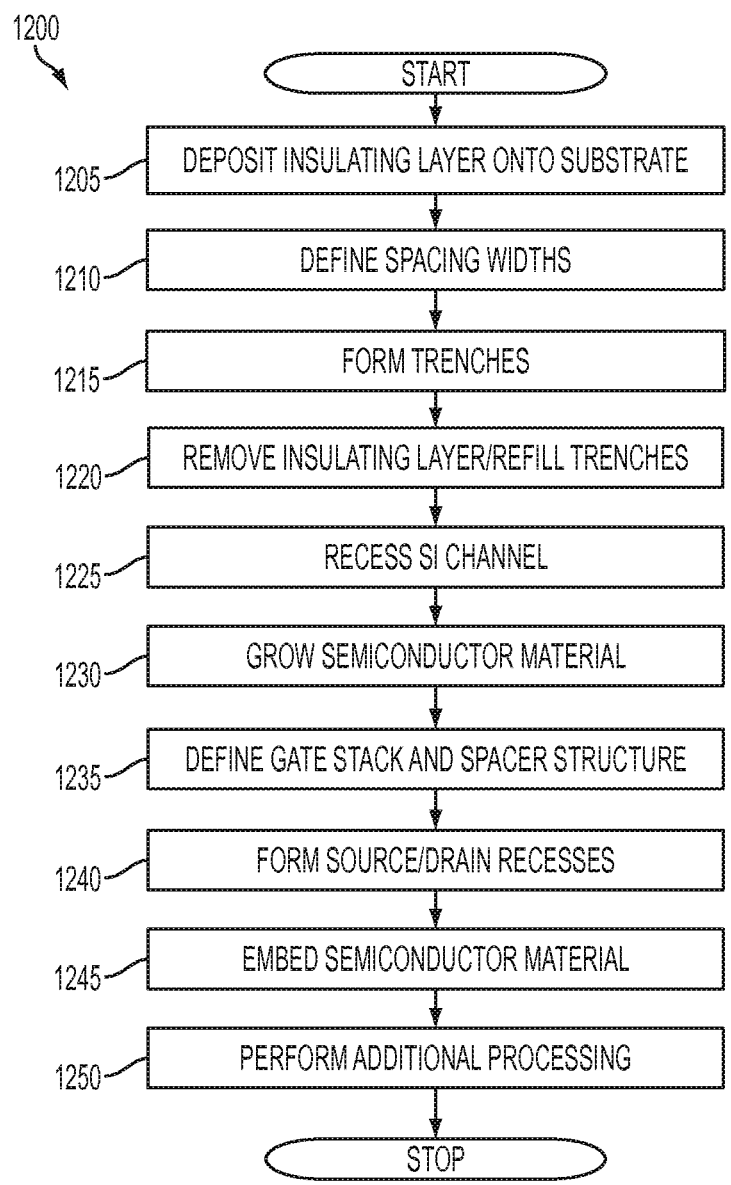
FIG. 12 illustrates a flow chart of a method for fabricating a transistor with uniaxial stress channels in accordance with exemplary embodiments.
Figure 13:
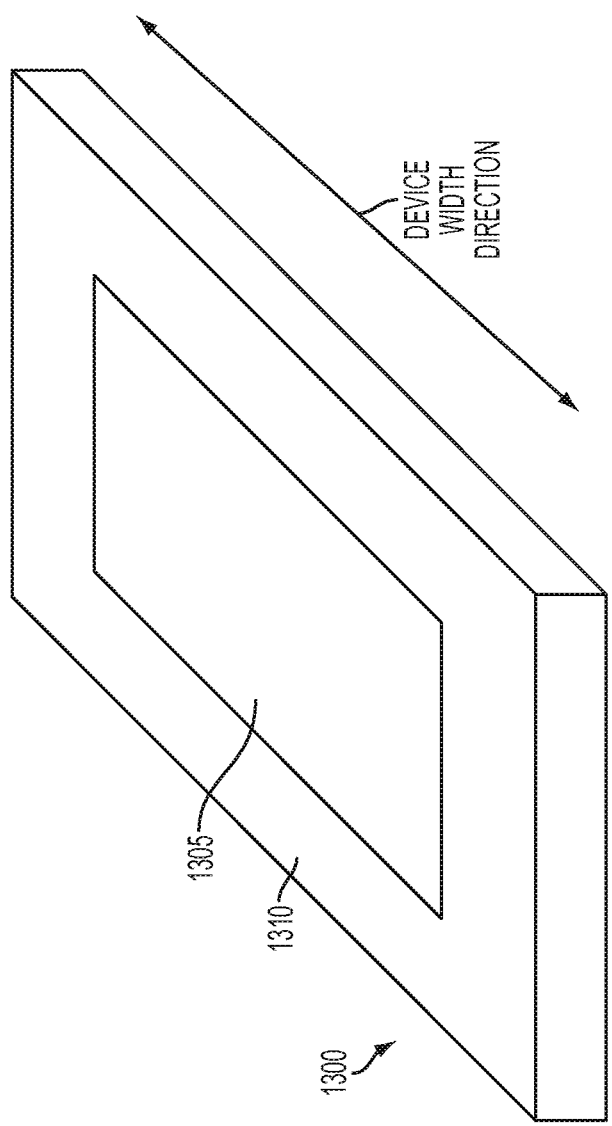
FIG. 13 illustrates an example of a substrate onto which the exemplary transistors described herein can be fabricated.

FIG. 12 illustrates a flow chart of a method 1200 for fabricating a transistor with uniaxial stress channels in accordance with exemplary embodiments. FIG. 13 illustrates an example of a substrate 1300 onto which the exemplary transistors described herein can be fabricated. In exemplary embodiments, the substrate 1300 is a shallow trench isolation (STI) structure. STI, also known as box isolation technique, is an integrated circuit feature which prevents electrical current leakage between adjacent semiconductor device components. For example, the substrate 200 can include a center of semiconducting material 1305, such as but not limited to, silicon (Si) and an insulating border 1310 such as but not limited to silicon dioxide ($SiO_2$). It will be appreciated that the substrate 1300 can be other materials and other structures other than STI in other exemplary embodiments.

Figure 14:
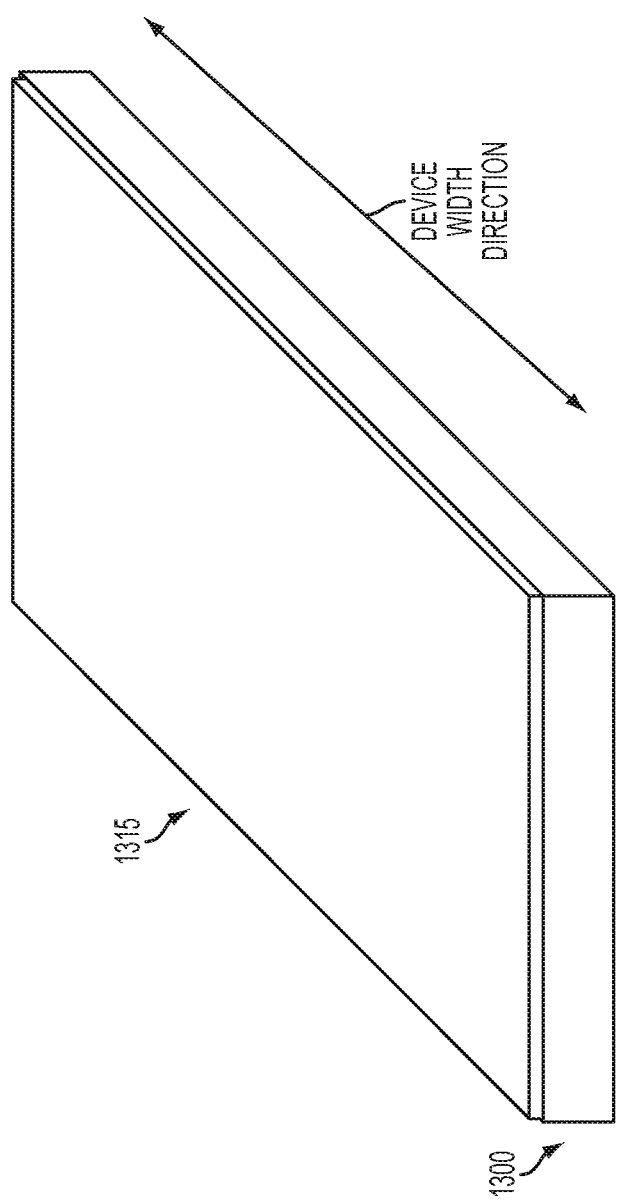
FIG. 14 illustrates an intermediate structure illustrating an insulating layer deposited on a substrate.

At block 1205, an insulating (hard-mask) layer 1315 is deposited onto the substrate 1300. The insulating layer 1315 can be any insulating material including but not limited to silicon nitride (SiN). FIG. 14 illustrates an intermediate structure illustrating the insulating layer 1315 deposited on the substrate 1300. At block 1210, narrow spacings 1320 are defined in the insulating layer 1315 over the substrate 1300. In exemplary embodiments, the spacing width can be as low as 20 nm. In addition, the insulating layer 1315 can be formed using any suitable deposition technique such as but not limited to FinFet spacer image transfer (SIT). The term "Fin-FET" is a generic term to describe any fin-based, multigate transistor architecture regardless of number of gates. It can also be appreciated that any suitable photolithography and masking methods are implemented to define the spacings 1320. In addition, any suitable etching techniques such as, but not limited to, wet chemical etching and reactive ion etching (RIE) are implemented to define the spacings 1320 at block 1210. FIG. 15 illustrates an intermediate structure showing the spacings 1320 defined over the substrate 1300. It should be noted that not only a narrow nitride hardmask is needed to achieve the desired uniaxial transport, a narrow pitch is also required to maximize the active device effective width per footprint. As the dummy device occupies chip area without contributing to the drive current.

At block 1215, trenches are defined into the silicon portion of the substrate 1300 between the spacings 1320. Any suitable photolithography and masking methods are implemented to define the trenches. In addition, any suitable etching techniques such as, but not limited to, wet chemical etching and RIE are implemented. FIG. 16 illustrates an intermediate structure showing the trenches 1325. FIG. 16A illustrates a cross sectional view of a region of the intermediate device under the remaining portion of the insulating layer 1315 and FIG. 16B illustrates a cross-sectional view of the intermediate device at a trench 1325.

Figure 17A:
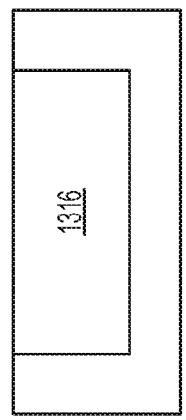
FIG. 17A illustrates a cross sectional view of a region of the intermediate device of FIG. 17 at an insulating refill.
Figure 17B:
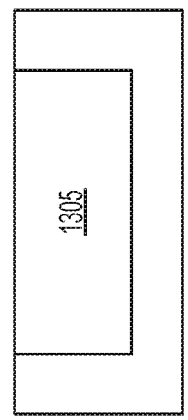
FIG. 17B illustrates a cross-sectional view of the intermediate device of FIG. 17 at semiconducting material.
Figure 17:
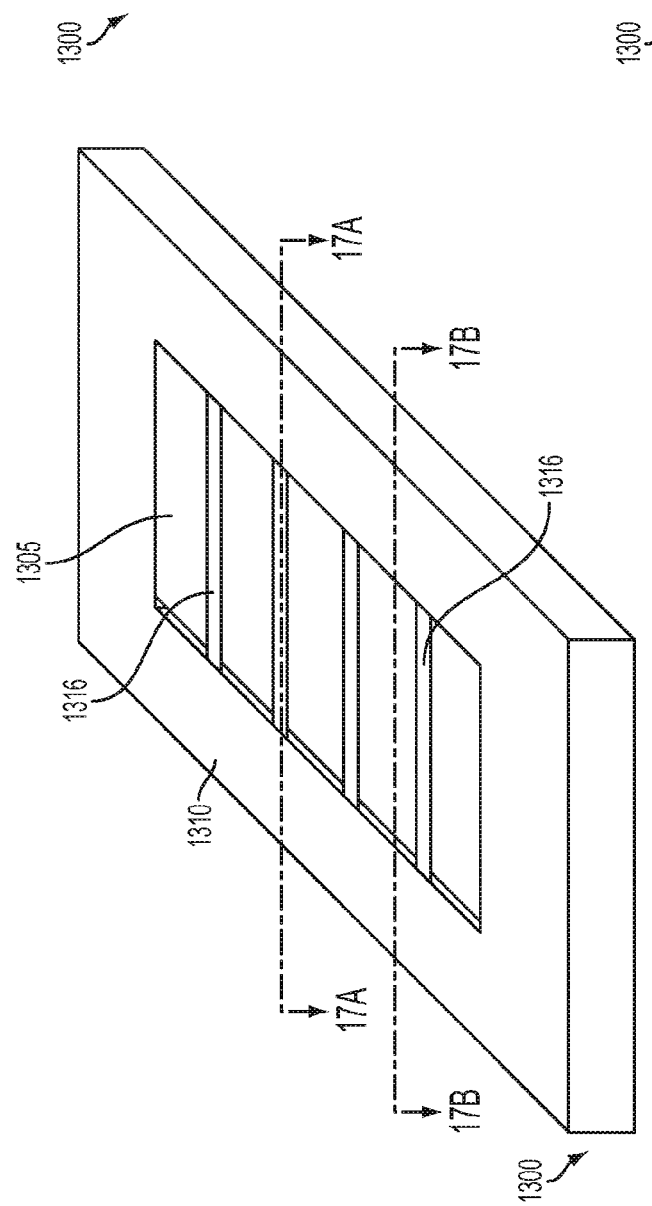
FIG. 17 illustrates an intermediate structure showing an insulating refill within a semiconducting material.

At block 1220, the remaining insulating layer 1315 is removed, and the trenches 1325 are refilled with an insulating material (i.e., insulating re-fill 1316). In exemplary embodiments, the insulating re-fill 1316 is the same material as the removed insulating layer 1315 (e.g., SiN). FIG. 17 illustrates an intermediate structure showing the insulating refill 1316 within the semiconducting material 1305. FIG. 17A illustrates a cross sectional view of a region of the intermediate device at the insulating refill 1316 and FIG. 17B illustrates a cross-sectional view of the intermediate device at the semiconducting material 1305.

Figure 18A:
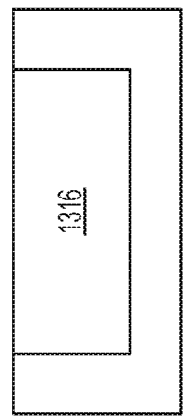
FIG. 18A illustrates a cross sectional view of a region of the intermediate device of FIG. 18 at an insulating refill.
Figure 18B:
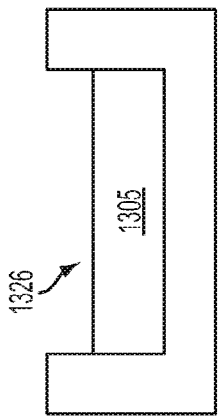
FIG. 18B illustrates a cross-sectional view of the intermediate device of FIG. 18 at Si recesses.
Figure 18:
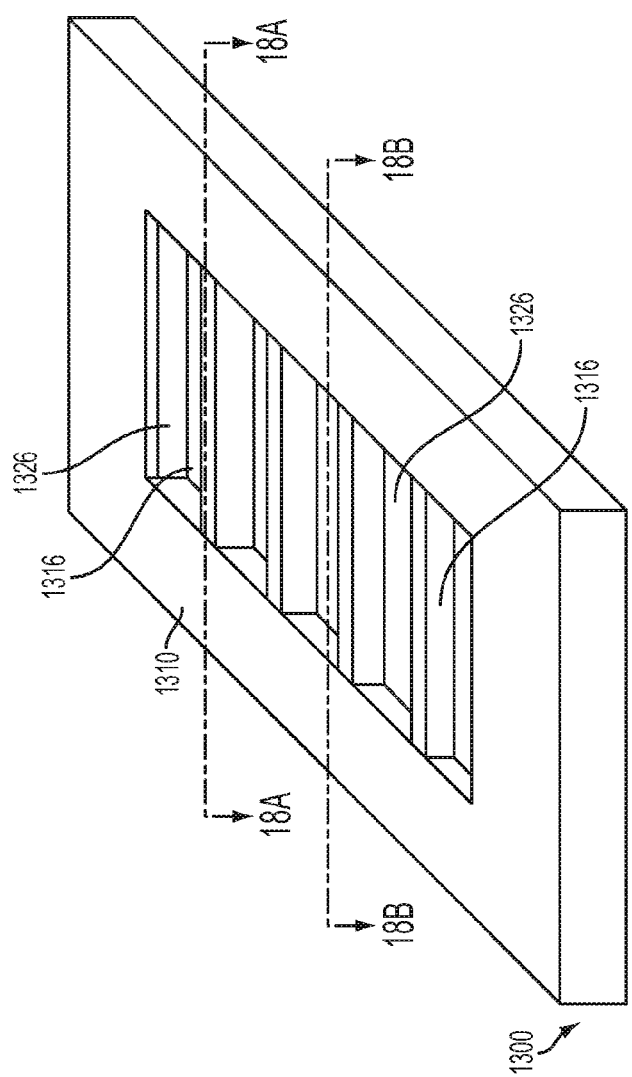
FIG. 18 illustrates an intermediate structure showing Si recesses.

At block 1225, recesses are defined into the semiconducting material 1305 of the substrate 1300 between the insulating refill 1316. Any suitable photolithography and masking methods are implemented to define the recesses. In addition, any suitable etching techniques such as, but not limited to, wet chemical etching and RIE are implemented. FIG. 18 illustrates an intermediate structure showing the Si recesses 1326. FIG. 18A illustrates a cross sectional view of a region of the intermediate device at the insulating refill 1316 and FIG. 18B illustrates a cross-sectional view of the intermediate device at the Si recesses 1326.

At block 1230, a suitable semiconductor material 1330 is grown within the recesses 1326. In exemplary embodiments, the semiconductor material is SiGe. The semiconductor material 1330 can be grown with any suitable technique, including, but not limited to MBE. As described herein, SiGe channel pFETs show superior hole mobility especially in narrow width devices due to the uniaxial stress enhanced mobility. FIG. 19 illustrates an intermediate structure illustrating the SiGe growth within the recesses 1326. FIG. 19A illustrates a cross sectional view of a region of the intermediate device at the insulating refill 1316 and FIG. 19B illustrates a cross-sectional view of the intermediate device at the semiconductor material 1330, and further illustrating the semiconducting material 1305.

Figure 20A:
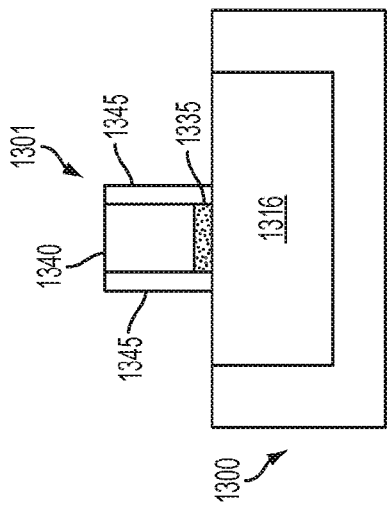
FIG. 20A illustrates a cross sectional view of a region of the intermediate device of FIG. 20 at insulating refill under a gate stack.
Figure 20B:
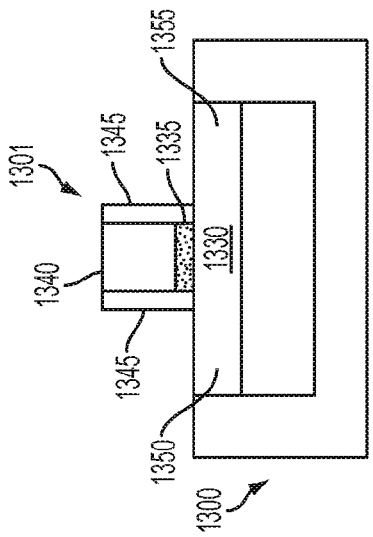
FIG. 20B illustrates a cross-sectional view of the intermediate device of FIG. 20 underneath a gate stack.
Figure 20:
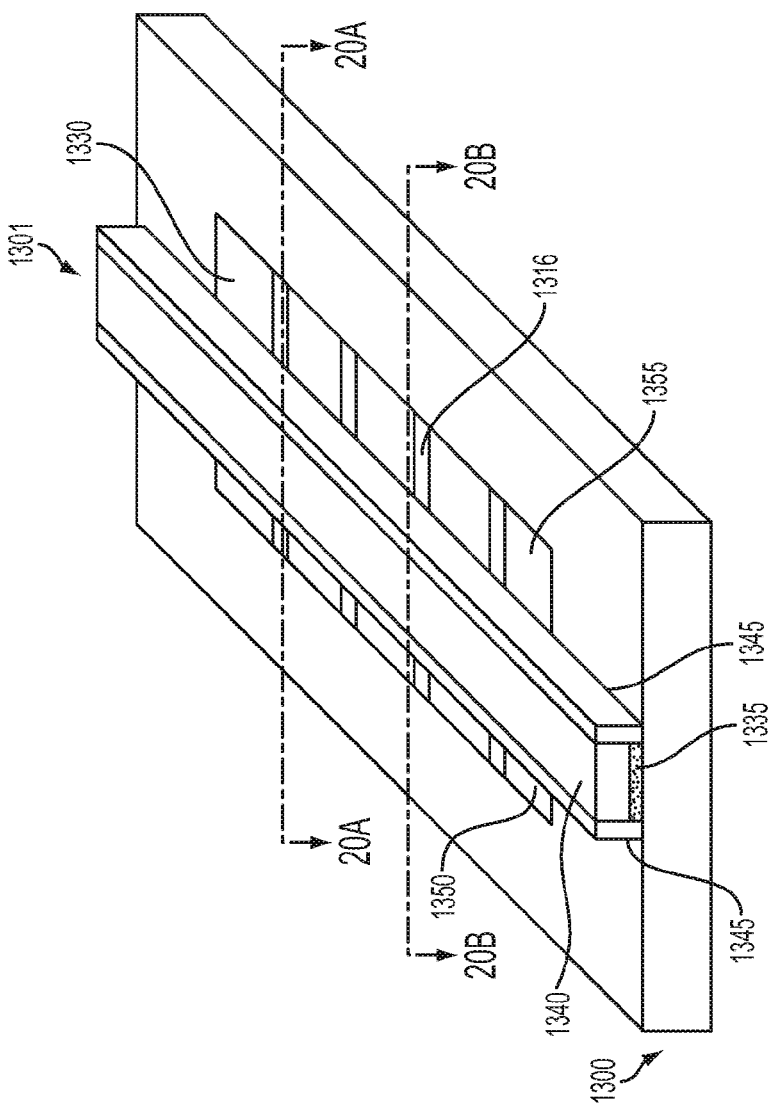
FIG. 20 illustrates an intermediate structure showing a gate stack and spacer regions as well as source and drain regions.

At block 1235, a gate stack 1301 and spacer structure is defined. It can be appreciated that the gate stack 1301 can be any suitable gate stack. For example, the exemplary transistors described can be high-κ metal-gate (HKMG) transistors in which high-κ dielectrics are used in conjunction with metals to form the gate stack 1301. The term "high-κ dielectric" refers to a material with a high dielectric constant κ (for example, as compared to $SiO_2$) used in semiconductor manufacturing processes, which replaces the $SiO_2$ only gate dielectric. The gate stack 1301 can therefore include an HK dielectric layer 1335 deposited over the insulating refill 1316 and the semiconductor material 1330. The HK dielectric layer 1335 can be any suitable HK dielectric material such as, but not limited to, hafnium (Hf). The gate stack 1301 can further include a metal layer 1340 including but not limited to aluminum (Al). Suitable isolating spacers 1345 are then defined adjacent the gate stack 1301. As further described herein, the spacers 1345 are any suitable insulating material (e.g., SiN) that provides isolation between the gate stack 1301 and the subsequently defined source and drain regions, which are subsequently defined in the SiGe regions 1350, 1355 adjacent to the gate stack 1301. Any suitable photolithography and masking methods are implemented to define the gate stack 1301. In addition, any suitable etching techniques such as, but not limited to, wet chemical etching and RIE are implemented. FIG. 20 illustrates an intermediate structure showing the gate stack 1301 and spacer regions as well as the source and drain regions. FIG. 20A illustrates a cross sectional view of a region of the intermediate device at the insulating refill 1316 under the gate stack 1301. It can be appreciated that the presence of the spacer 220 underneath the gate stack 201 causes electrical isolation. Thus the devices in these regions are "dummy devices" separated the active devices described further herein. FIG. 20B illustrates a cross-sectional view of the intermediate device underneath the gate stack 1301, and in which become active devices. It will be appreciated that the SiGe regions 1350, 1355 become the source/drain regions for the active device after further fabrication, as further described herein.

Figure 21A:
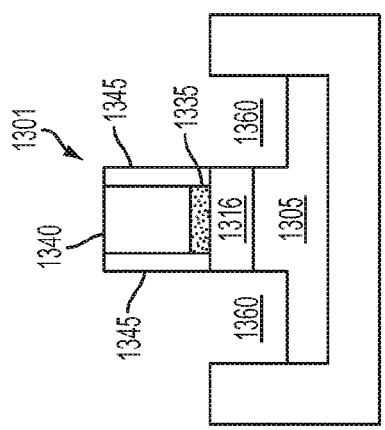
FIG. 21A illustrates a cross sectional view of a region of the intermediate device of FIG. 21 showing a remaining portion of insulating refill adjacent the gate stack.
Figure 21B:
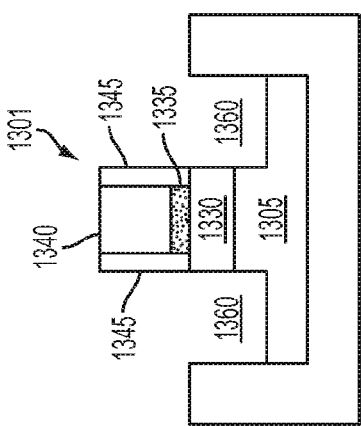
FIG. 21B illustrates a cross-sectional view of the intermediate device of FIG. 21 underneath a gate stack.
Figure 21:
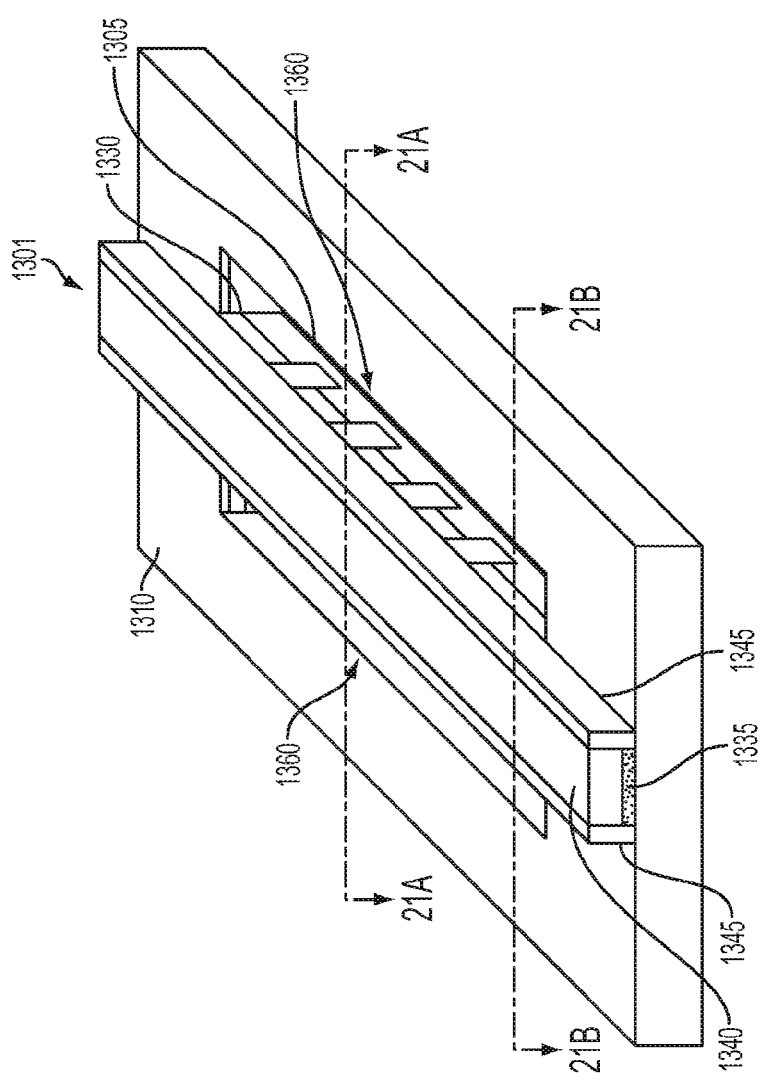
FIG. 21 illustrates an intermediate structure showing a gate stack and recesses into which sources and drains are subsequently defined.

At block 1240, source/drain recesses 1360 are formed adjacent the gate stack 1301. The formation of the recesses removes the SiGe regions 1350, 1355 and the remaining semiconducting material 1305 and the insulating refill 1316 adjacent the gate stack 201. FIG. 21 illustrates an intermediate structure showing the gate stack 1301 and recesses 1360 into which the sources and drains are subsequently defined. FIG. 21A illustrates a cross sectional view of a region of the intermediate device showing the remaining portion of the insulating refill 1316 adjacent the gate stack 1301, and the recesses 260. As described herein, it can be appreciated that the presence of the insulating refill 1316 causes electrical isolation. Thus the devices in these regions are "dummy devices" separated the active devices. FIG. 21B illustrates a cross-sectional view of the intermediate device underneath the gate stack 1301, which become active devices, and the recesses 1360. As described herein, it will be appreciated that the recesses 1360 are subsequently filled with a semiconducting material into which the source/drain regions are defined.

At block 1245, a semiconductor material 1365 is embedded in the recesses 1360. In exemplary embodiments, the semiconductor material 1365 is SiGe, and shares similar properties as the semiconducting material 1330 grown at block 1230. For example, the semiconducting materials 1330, 1365 may be insitu doped with the same dopants. It can be appreciated that the source and drain regions of the semiconducting material can be doped with the same or different materials depending on the application. The semiconductor material 1365 can be grown with any suitable technique, including, but not limited to MBE. FIG. 22 illustrates an intermediate structure showing the gate stack 1301 and the semiconducting material 1365 onto which the sources and drains are subsequently defined. FIG. 22A illustrates a cross sectional view of a region of the intermediate device showing the remaining portion of the insulating refill 1316 adjacent the gate stack 1301, and the semiconducting material 265. As described herein, it can be appreciated that the presence of the insulating refill 1316 underneath the gate stack 1301 causes electrical isolation. Thus, the devices in these regions are "dummy devices" separated the active devices. FIG. 22B illustrates a cross-sectional view of the intermediate device underneath the gate stack 1301, which become active devices, and the semiconducting material 1365. FIG. 22B also illustrates the semiconducting material 1330 and the semiconducting material 1365. It can further be appreciated that the semiconducting materials 1330, 1365 are electrically and physically contiguous.

At block 1250, additional processing steps are performed to complete device fabrication. For example, standard front-end-of-line (FEOL) techniques can be performed. FIG. 23 illustrates a final FET structure that includes an interconnect bar 1370 that interconnects the fabricated active devices as described herein. The final FET structure further includes a liner 1375 covering the final structure. The liner 1375 may be formed adjacent to or separated from the source/drain region. The nitrogen liner may be formed to retard vertical diffusion of the dopant and also to retard lateral diffusion as well. The liner 1375 may be formed by implantation of nitrogen to a given depth before the implantation of source/drain dopant to a lesser depth. FIG. 23A illustrates a cross sectional view of a region of the final FET. FIG. 23B illustrates a cross section view of another region of the final FET device. FIG. 23A represents a fake inactive "dummy" device. The device in FIG. 23A does not contribute to the off-state leakage. The threshold voltage of the fake device can be adjusted by the insulator layer represented by the portion of the insulting refill 1316. FIGS. 23A and 23B further illustrate the interconnect bar 1370 and the liner 1375.

Figure 24A:
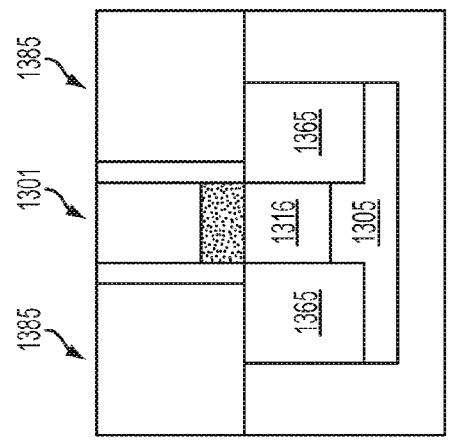
FIG. 24A illustrates a cross sectional view of a region of the final FET device of FIG. 24.
Figure 24B:
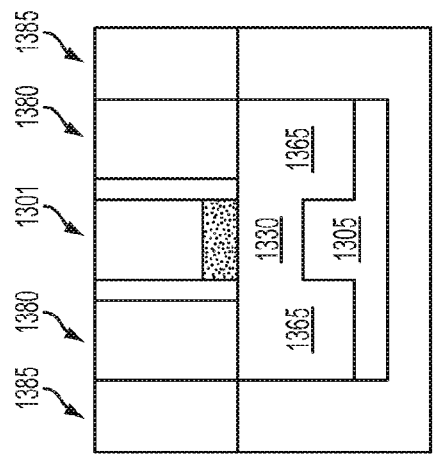
FIG. 24B illustrates a cross section view of another region of the final FET device of FIG. 24.
Figure 24:
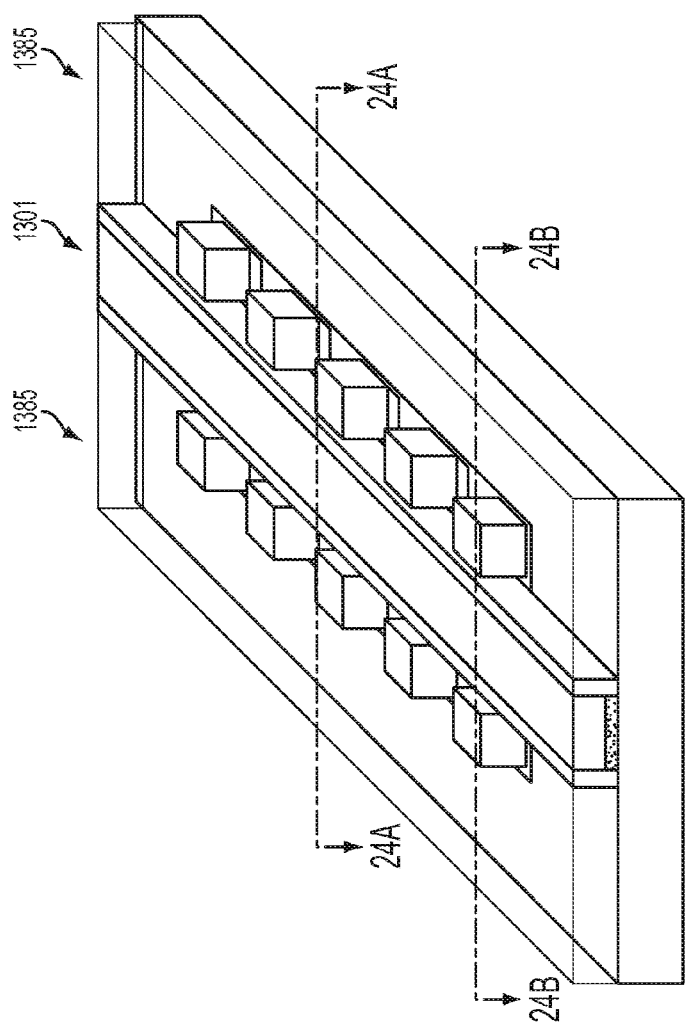
FIG. 24 illustrates a final FET structure that includes interconnect holes that interconnect the fabricated active devices.

FIG. 24 illustrates a final FET structure that includes interconnect holes 280 that interconnect the fabricated active devices as described herein. The final FET structure further includes a liner 1385 covering the final structure. The liner 1385 may be formed adjacent to or separated from the source/drain region. The nitrogen liner may be formed to retard vertical diffusion of the dopant and also to retard lateral diffusion as well. The liner 1385 may be formed by implantation of nitrogen to a given depth before the implantation of source/drain dopant to a lesser depth. FIG. 24A illustrates a cross sectional view of a region of the final FET. FIG. 24B illustrates a cross section view of another region of the final FET device. FIG. 24A represents a fake inactive "dummy" device. The device in FIG. 24A does not contribute to the off-state leakage. The threshold voltage of the fake device can be adjusted by the insulator layer represented by the portion of the insulating refill 1316. FIGS. 11A and 11B further illustrate the interconnect holes 1380 and the liner 1385.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A transistor with uniaxial stress channels, the transistor comprising:
    an insulating layer defined on a substrate;
    bars defined within the insulating layer;
    a channel recessed into the substrate;
    a first semiconducting material defined in the channel;
    a gate stack defined over the bars and semiconducting material;
    source and drain recesses defined in the semiconducting material; and
    a second semiconducting material embedded into the source and drain recesses.

2. The transistor as claimed in claim 1 wherein the substrate is a shallow trench isolation (STI) substrate.

3. The transistor as claimed in claim 2 wherein the STI substrate includes a silicon center.

4. The transistor as claimed in claim 3 wherein the channels are defined in the silicon center.

5. The transistor as claimed in claim 4 wherein the first semiconducting material is silicon germanium (SiGe).

6. The transistor as claimed in claim 5 wherein the second semiconducting material is silicon germanium (SiGe).

7. The transistor as claimed in claim 1 wherein the bars electrically isolate the gate stack from the substrate, thereby forming dummy devices.

8. The transistor as claimed in claim 7 wherein the bars separate active devices.

9. A transistor with uniaxial stress channels, the transistor comprising:
  an insulating layer partially defined on a substrate;
  spacing widths defined within the insulating layer;
  trenches defined within the spacing widths and partially refilled;
  a channel recessed into the substrate;
  a first semiconducting material defined in the channel;
  a gate stack defined over the bars and semiconducting material;
  defining source and drain recesses defined in the semiconducting material; and
  a second semiconducting material embedded into the source and drain recesses.

10. The transistor as claimed in claim 9 wherein the substrate is a shallow trench isolation (STI) substrate.

11. The transistor as claimed in claim 10 wherein the STI substrate includes a silicon center.

12. The transistor as claimed in claim 11 wherein the channels are defined in the silicon center.

13. The transistor as claimed in claim 12 wherein the first semiconducting material is silicon germanium (SiGe).

14. The transistor as claimed in claim 13 wherein the second semiconducting material is silicon germanium (SiGe).

15. The transistor as claimed in claim 11 wherein the trenches are defined in the silicon center.

16. The transistor as claimed in claim 15 wherein a material for the trench refill is a same material for the insulating layer.

17. The transistor as claimed in claim 9 wherein the bars electrically isolate the gate stack from the substrate, thereby forming dummy devices.

18. The transistor as claimed in claim 17 wherein the bars separate active devices.

19. A transistor structure, comprising:
  a plurality of active devices, each of the plurality of active devices separated by a dummy device from a plurality of dummy devices, the plurality of active devices and the plurality of dummy devices disposed in a substrate,
  wherein each dummy device of the plurality of dummy devices is electrically isolated from the substrate.

20. The structure as claimed in claim 19 wherein the active devices are electrically interconnected.

* * * * *